United States Patent
Erb

(10) Patent No.: US 8,620,250 B2
(45) Date of Patent: Dec. 31, 2013

(54) RESONATOR-BASED FILTERING

(75) Inventor: Jean-Luc Erb, San Diego, CA (US)

(73) Assignee: Hollinworth Fund, L.L.C., Dover, DE (US)

( * ) Notice: Subject to any disclaimer, the term of this patent is extended or adjusted under 35 U.S.C. 154(b) by 117 days.

(21) Appl. No.: 13/283,292

(22) Filed: Oct. 27, 2011

(65) Prior Publication Data

US 2012/0108167 A1    May 3, 2012

Related U.S. Application Data

(60) Provisional application No. 61/407,403, filed on Oct. 27, 2010.

(51) Int. Cl.
  *H04B 1/10*    (2006.01)
  *H04K 3/00*    (2006.01)
(52) U.S. Cl.
  USPC .................. 455/307; 310/313 A; 333/193

(58) Field of Classification Search
  USPC .......... 455/307; 310/313 A, 313 R; 333/193, 333/195
  See application file for complete search history.

(56) References Cited

U.S. PATENT DOCUMENTS

| | | | |
|---|---|---|---|
| 6,501,208 B1 * | 12/2002 | Kuroda | 310/313 R |
| 2002/0096968 A1 * | 7/2002 | Yamamoto | 310/313 B |
| 2008/0197941 A1 * | 8/2008 | Suzuki et al. | 333/189 |
| 2009/0152981 A1 * | 6/2009 | Owaki et al. | 310/313 B |
| 2011/0193656 A1 | 8/2011 | Erb et al. | |

* cited by examiner

*Primary Examiner* — Lee Nguyen

(74) *Attorney, Agent, or Firm* — Novak Druce Connolly Bove + Quigg LLP

(57) ABSTRACT

A filter may be constructed from multiple acoustic elements in parallel. A filtering method may comprise passing a signal to be filtered through such parallel acoustic elements. Such filtering may be applicable to communication devices.

22 Claims, 7 Drawing Sheets

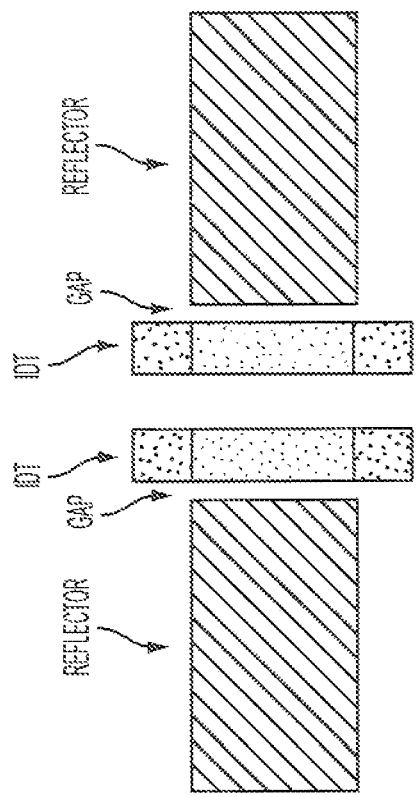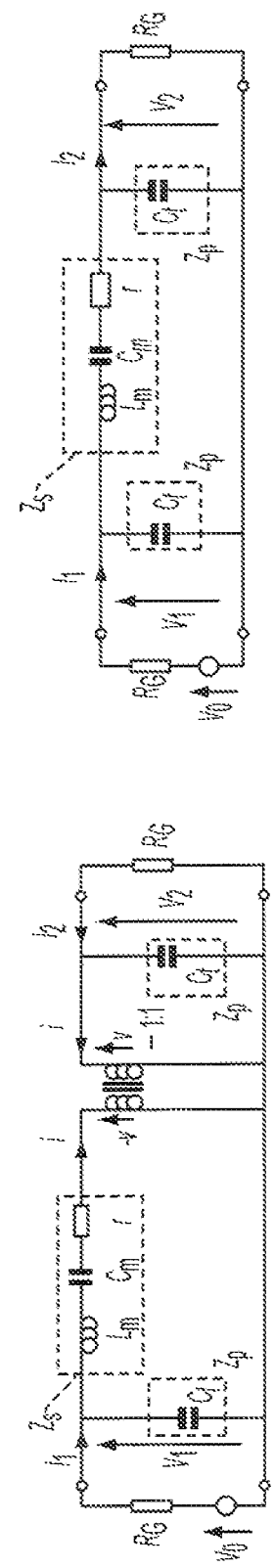
FIG. 4(a)
FIG. 4(b)
FIG. 4(c)

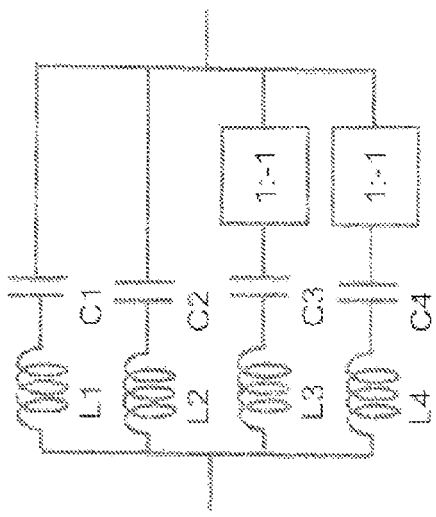

FIG. 6

This is a 4th order example.
With single-ended I/Os

The discussion can be extended
To any order
Differential I/Os
All kinds of impedances

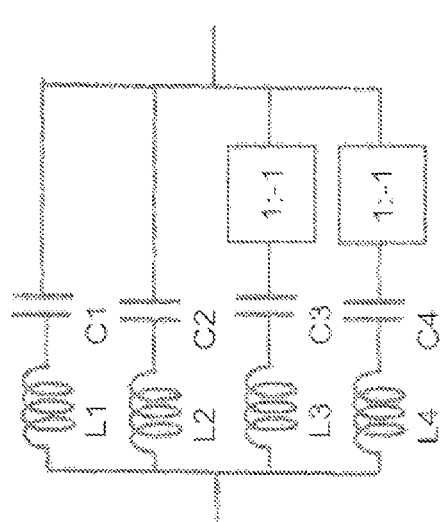

FIG. 7

L1, C1 → One-port resonator

L2, C2 and L3, C3 → 2-port 2 pole resonator

L4, C4 → Two-port 1-pole symmetric resonator

These are just examples and we are not limited
To these choices.
For instance,
L1, C1 could be implemented as a two-port
1-pole asymmetric resonator

US 8,620,250 B2

RESONATOR-BASED FILTERING

CROSS-REFERENCE TO RELATED APPLICATION

This application is a non-provisional application based on U.S. Provisional Patent Application No. 61/407,403, filed on Oct. 27, 2010, which is incorporated by reference herein, and to which priority is claimed.

BACKGROUND

A class of filters, resonators and design methods thereof, which are suited for monolithic integrations, are described, e.g., in U.S. Provisional Patent Application No. 61/303,596, filed on Feb. 11, 2010. Designs and implementations of single-ended and differential filters based on acoustic wave resonators and effects arising from anti-resonance absorption are described in U.S. Provisional Patent Application No. 61/311,706 filed on Mar. 8, 2010. Other filters, resonators, and design methods thereof may be found in U.S. patent application Ser. No. 12/950,908, filed on Nov. 19, 2010. These applications are hereby incorporated by reference herein.

SUMMARY OF VARIOUS EMBODIMENTS

Various embodiments of the present invention may be directed to various apparatus and/or methods that may be used for implementing filters, e.g., for radio-frequency (RF) filtering. Various such embodiments may be based on the use of resonators.

BRIEF DESCRIPTION OF THE DRAWINGS

Various embodiments of the invention will now be described in further detail in conjunction with the accompanying drawings, in which:

FIG. 4, which includes FIGS. 4(a)-4(c), shows alternate exemplary configurations/structures according to further embodiments of the invention;

FIG. 5, which includes

FIG. 6 illustrates an exemplary transversal architecture according to various embodiments of the invention;

FIG. 7 illustrates how the arrangement of FIG. 6 may be implemented using resonator structures, according to an embodiment of the invention;

DETAILED DESCRIPTION OF VARIOUS EMBODIMENTS OF THE INVENTION

Some of the filter architectures and designs described in some of the above-referenced applications may use one or more acoustic wave resonators as building blocks. The filters may incorporate series and/or parallel branches. The acoustic wave resonators may have two or more resonant frequencies, where, in the two-frequency case, the difference between these frequencies may be related to the effective electromechanical coupling coefficient, $K^2_{eff}$. While electromechanical resonators can be coupled electrically, in the case of acoustic wave resonators, the resonators may be coupled acoustically as well. For example, acoustic coupling may be present in a filter configuration having acoustic resonators positioned proximate each other.

Figure 1:
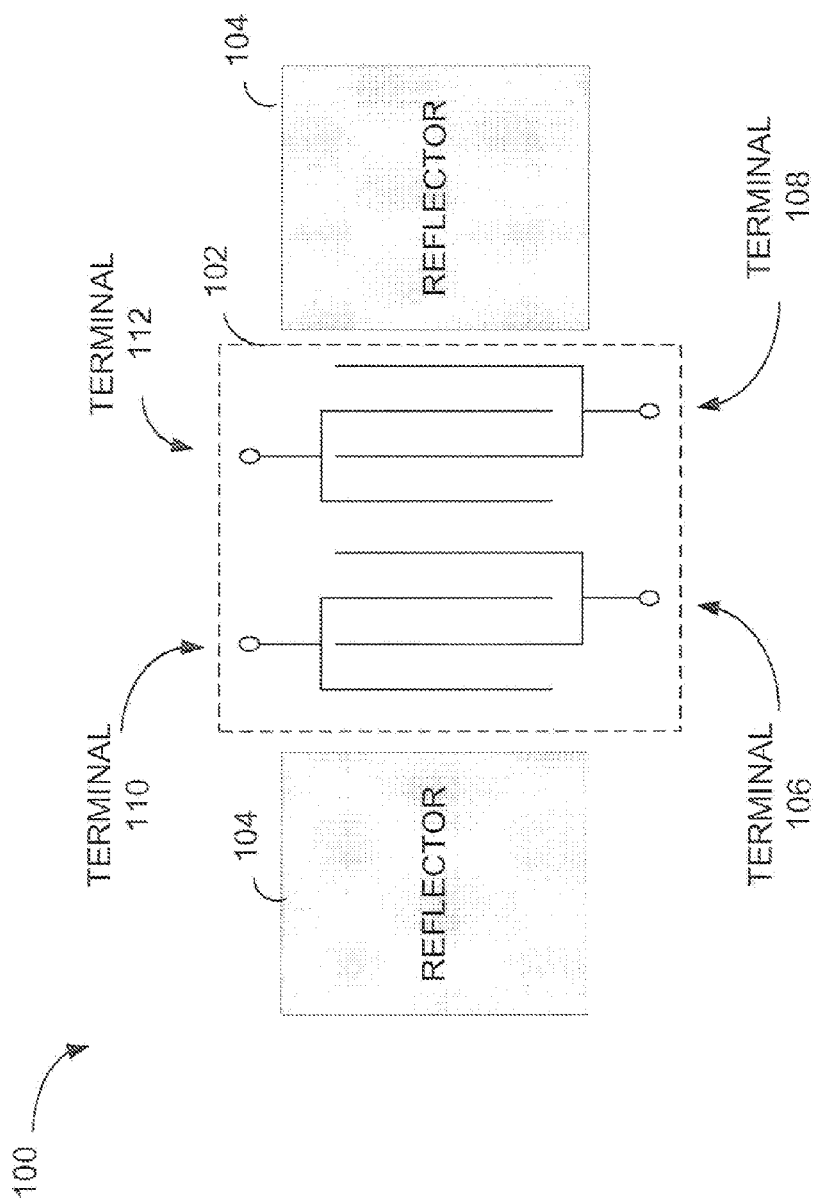
FIG. 1 shows an example of a two-port resonator structure and its electrical equivalent, according to an exemplary implementation.

One example of acoustic coupling may be found in a two-port acoustic wave resonator, where two identical transducers may be coupled acoustically. This may result in a resonator with a motional resonance, and which may have static shunt capacitance at the input/output nodes but having no capacitance in parallel with the motional branch. Designs and configurations that result in acoustic coupling may be used to remove anti-resonance effects and hence to extend achievable filter bandwidths. An example of an embodiment of a two-port structure and its electrical equivalent circuit is given in FIG. 1. The example of FIG. 1 illustrates that surface acoustic wave (SAW) devices may be used in some embodiments. However, this example is not limited to SAW transducers, and analogous bulk acoustic wave (BAW) structures may be used, as well, for example. Such a resonator can be used as a building block in our transversal filter architecture.

Figure 2:
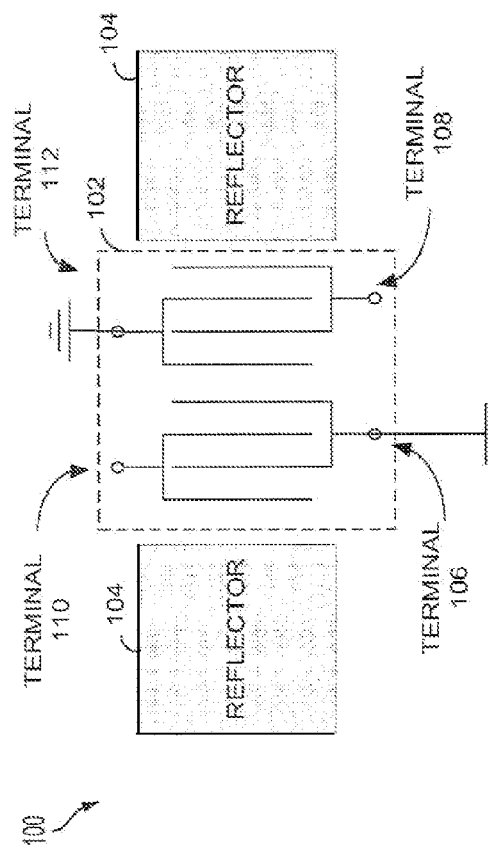
FIG. 2 shows a further example of how the two-port resonator structure of FIG. 1 may be coupled, in some exemplary embodiments.
Figure 3:
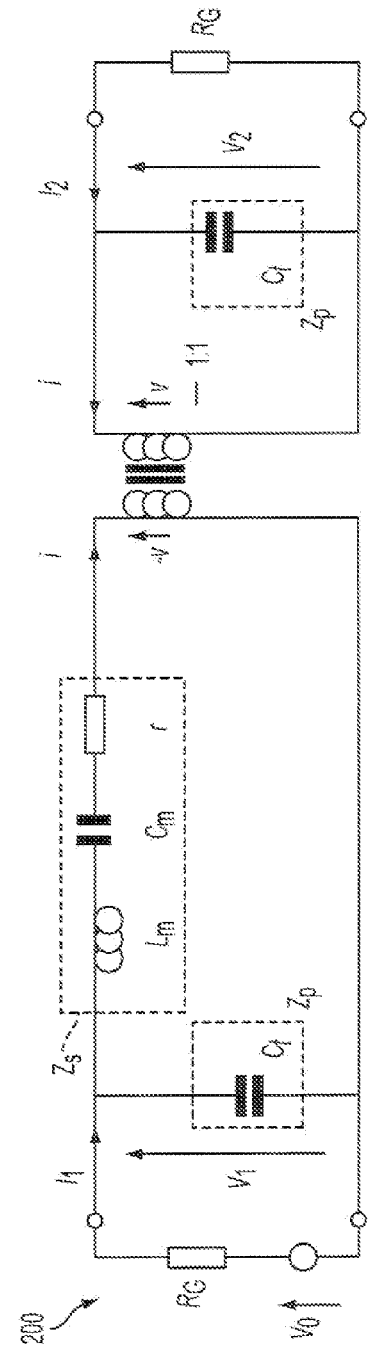
FIG. 3 shows a circuit that may represent an equivalent circuit to the configuration shown in FIG. 2.

The device 100 of FIG. 1 may implement a resonator based on an Inter-Digital Transducer (IDT) unit 102, which may include two similar IDTs, and which may be coupled between reflectors 104. A gap may be placed between the IDT unit 102 and each of the reflectors 104, so that the IDT unit 102 does not connect to the reflectors 104. Each IDT may have two terminals; in the example of FIG. 1, the IDT unit 102 is shown having four terminals, but the invention is not thus limited. In operation, an acoustic signal may be received at the IDT and may be transformed to a voltage. The resulting voltage may then be made available at an output terminal. The exemplary device 100 in FIG. 1 is shown as a 2-port device and may be configured so as to ground one or more of the terminals. Such a configuration may be used as a building block for a 2-port IDT resonator solution. FIG. 2 illustrates an exemplary configuration of the device 100 in which the terminals 106, 112 are shown coupled to a ground or reference voltage. The equivalent circuit 200 for this configuration is illustrated in FIG. 3. FIGS. 4(a)-4(c) illustrate alternate configurations and their equivalent circuits, showing symmetric and anti-symmetric modes.

Such acoustically coupled IDT solutions may serve to avoid a need to add elements to cancel anti-resonance, such as, for example, addition of a series capacitor in one of two complementary paths of a transversal filter architecture. Despite such potential benefits, impedance matching is one consideration in IDT solutions. Additional matching networks incorporated at source and load may be used to address impedance matching in some embodiments, but it may be desirable to provide a lower-cost way to address this. This could be achieved, e.g., by designing a suitable filter with complex source and/or load, or by adding a cancelling susceptance by any other means, which may serve to eliminate or reduce the need for the matching elements.

Therefore, if an appropriate combination of symmetric mode and anti-symmetric mode two-port resonators is used, the introduction of a 1:−1 transformer may be provided as part of the resonator design and need not be added externally; that is, at least a portion of the impedance matching issue may thus be addressed. By removing the need for the external combiner, one may be able to remove an element that adds its own loss to the overall insertion loss. It is noted, however, that a design consideration in doing so may involve ensuring that a traveling wave between transducers does not get too severely dampened too, which may reduce the quality factor (Q) of the resulting resonator. However, appropriate piezoelectric and wave choices can lead to very low attenuations.

Figure 5A:
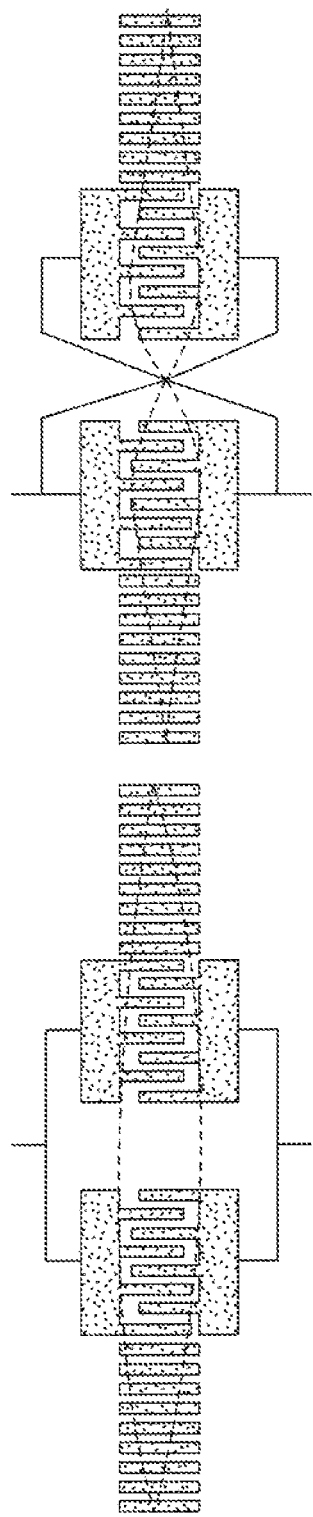
FIGS. 5(a)-5(b), shows an exemplary dual-mode resonator and an exemplary filtering application using one or more acoustic elements, which may be dual-mode resonators, according to various embodiments of the invention.
Figure 5B:
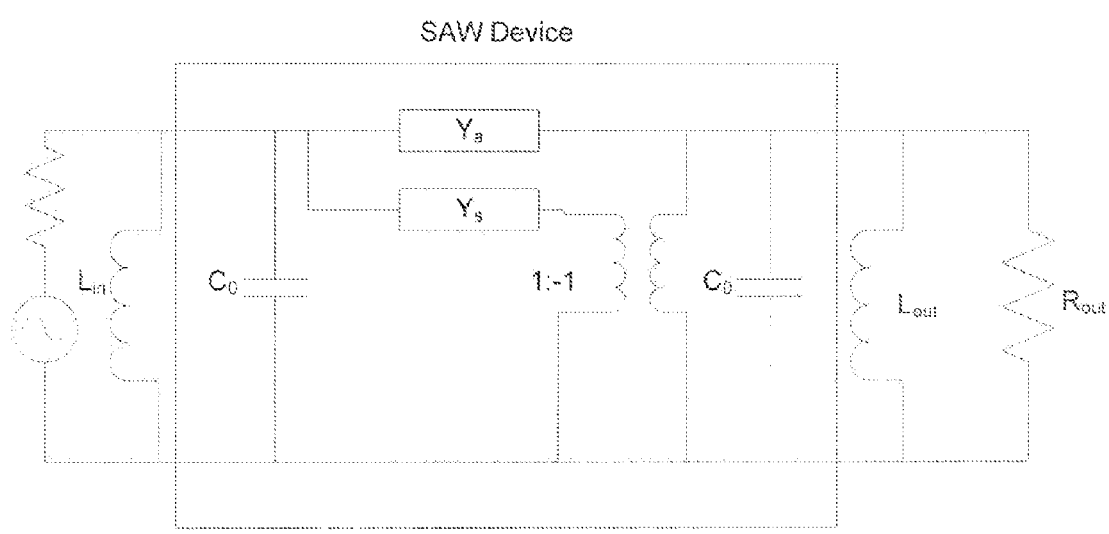

The two-port resonator discussed previously, e.g., in FIGS. 1-4, can be designed to resonate at two different frequencies. Acoustic coupling between two transducers may result in a double-mode resonator, which may be used as a building block, e.g., in a transversal filter architecture. In this way, a transversal filter may be built using acoustic resonators in the parallel paths. In cases where such resonators may include at least one 2-port solution, such as an IDT unit, the configuration may cancel the anti-resonance capacitance of the acoustic resonator. An example of a dual-mode resonator, such as a dual-mode SAW (DMS) is given in FIG. 5(a), and its electrical equivalent is shown in FIG. 5(b); however, the invention is not limited to this implementation.

Using a dual-mode resonator as a building block may provide further benefits. For example, a design may have two resonant frequencies, one in each of two complementary paths, and a combiner separating the two paths (a 1:−1 transformer) may be provided as part of the dual-mode resonator-based design. Moreover, the combiner may be ideal, or close thereto, as it may be derived from the phase difference between first and second-order modes; therefore, there may be no (or reduced) parallel, anti-resonances to cancel out.

A SAW RF filter relying solely on dual-mode resonators may be useful as a single-ended in/single-ended out type of architecture, because the combiner need not be implemented. To build a filter having an odd number of resonators, an example configuration may implement a standard one-port or two-port resonator, either of which may have motional admittance made up of a single resonance. A variety of resonators may be combined into a transversal filter. For example, a transversal filter may include multiple building blocks, including DMS solutions, two-port solutions, and/or one-port solutions. A combination of these structures may be provided in parallel between the source and load so as to form a transversal filter. In one embodiment of the present invention, a transversal filter may have acoustic elements (e.g., resonators) placed on the parallel paths of the filter, where one or more of the acoustic elements may include a 2-port resonator. Such an embodiment is conceptually illustrated as part of the example shown in FIG. 8. However, the invention is not thus limited, and a filter constructed with such parallel resonators may have further components that may not be shown.

Using these architectures, a variety of filter configurations may be realized, including, for example, a single-ended in/differential out filter architecture with a dual-mode SAW structure for balanced drive with good performance, hence eliminating the need for an external transformer. However, this is but one example, and the invention is not thus limited.

There may be a number of considerations in designing filters according to various embodiments of the invention. It may be desirable for acoustic damping of the traveling wave between the two transducers to be small. In BAW topologies, the wave may go through a dielectric between two metal-piezoelectric-metal stacks; in SAW topologies, the wave may typically remain in one piezoelectric medium. In the SAW case, it is easy to find a piezoelectric cut having no or minimal attenuation of the acoustic wave considered, which may allow for having two-port resonators with high quality factors.

The static capacitance of the IDT may be present at source and/or load. In the case of a dual-mode resonator, this shunt capacitance may be the same as the one seen from a standard resonator, even though there are two resonances. The ability to have a smaller shunt capacitance at the input/output of the electromechanical device for a given number of resonances may make it easier to design a filter's matching networks at source and load.

Whether using one-port, standard two-port, or dual-mode resonators, a common issue in a transversal filter architecture may be the addition of a matching network between source and load due to the effects of static capacitance. While some examples may incorporate a negative capacitor in shunt at source and load, according to some embodiments of the present invention, a physically implementable solution may add a shunt inductor. As mentioned earlier, the various techniques and solutions may allow a filter to have a complex valued source and/or load; nevertheless, even without this, an inductor may be used to replace the negative capacitor. Some of these techniques may allow for "resonating out" a positive capacitor.

Some example circuits may present a frequency dependent susceptance at source and load with a bandpass resonance characteristic. Weak or strong resonances, depending on the values of the static capacitances, can be introduced in the original filter design in order to preserve the bandwidth of the filter.

In order to present source and load with a weak resonance due to a shunt inductor-capacitor pair, a designer may use a large inductor and a small capacitor. Large inductors may also be better at not altering the insertion loss of the filter due to the finite quality factor of the discrete or embedded inductor. Small static capacitances may occur for small resonators. Such resonators may be designed to prevent strong spurious content and low power rating. In order to use small resonators, one may scale the 'system' and/or reference impedance of the filter, and/or one may turn a resonator into several resonators in series, which may be identical.

When scaling the filter to a different impedance or designing for a complex-valued source/load, some designs may revert back to the common 50Ω standard impedance using high bandwidth matching networks that may be derived, e.g., by computer optimization.

A variety of configurations may be considered for transversal filters that incorporate the various techniques, such as the two-port and/or DMS solutions, discussed above. Such designs and solutions may be fabricated, e.g., using a GaAs semiconductor process or other processes, such as on a $LiNbO_3$ or a $LiTaO_3$ base. Additionally, quartz may be used to build such devices. The solutions discussed herein may also be fabricated using a variety of other technologies. By coupling IDT resonators in parallel, the present invention may take advantage of the acoustic coupling to remove unwanted anti-resonance capacitance without additional susceptance elements. Further, while multiple IDTs may be coupled in parallel, the anti-resonance capacitance may not increase, and this may help to simplify the design of the filter. Such filter embodiments may also increase the bandwidth of the filter and may allow for medium- to wide-band filters.

A further filter design technique May be based on one and/or two-port mixing and complementing capacitance ($C_e$) with a two-port resonator. FIG. 6 illustrates an example of a transversal filter architecture that may be designed based on conventional LC circuit techniques. As resonators are basically LC arrangements at some point in the design process, the following discussion considers LC resonators coupled to source and load. A transformation (1:−1) may be used to separate the resonators into two categories. The following discussion may apply to any order differential input-output and may consider various impedances.

Each LC to SAW/BAW transformation may introduce at least one capacitance into the design. A one-port configuration may involve accounting for a capacitance, Co, in series between source and load. A two-port configuration may involve accounting for a capacitance, Co, in shunt at source and load. The design may consider how to handle these capacitors. For capacitance in series between source and load, one may even the capacitance in the complementary paths to end up with 2Co in shunt at source and load. Capacitors in shunt at source and load may be cancelled out, e.g., by adding an inductor or designing the filter to match a complex source/load. Further issues in such designs may result from acoustic coupling, such as among the resonator structures, and may include the following.

As illustrated in FIG. 7, each LC arrangement may be implemented by an acoustic wave structure. Such structures may include hybrid structures incorporating MEMS and NEMS with other technologies. Some embodiments may focus on designing for a high Q using technologies such as BAW and SAW, which in many applications may have a known and tested performance. Each arm (Lm, Cm, with or without 1:−1 transformation) may be replaced by a 1-port, 2-port 1 pole, 2-port 2 pole, or multi-port/multi-pole resonator. The examples given provide some of these possibilities, but the invention is not limited to these examples.

Various filter embodiments may tend to avoid ultra low $K^2$ materials, which means a very large (absolute value) capacitance at source and load. Further these designs may avoid the need for impedance scaling and its matching network. In some embodiments, there may be no need for impedance scaling and its need for very small resonators (and the associated fear of spurious content when attempted to achieve too high an impedance). In some embodiments, there may be no need for a combiner, as the 1:−1 transformer may be included as part of a two-port resonator (symmetric mode). Furthermore, in implementations based on SAW technology, many resonances/eigenmodes may be used and achieved.

Two-port resonator designs may involve further information on how well they behave with respect to spurious content. Some embodiments may consider how much coupling (eigenmode separation) may be possible, especially when implementing dual-mode resonators (the two modes may be farther apart than just 1-2 MHz). For spurious content, the coupling and individual Cm values can be controlled; the result may be a powerful filter.

Figure 8:
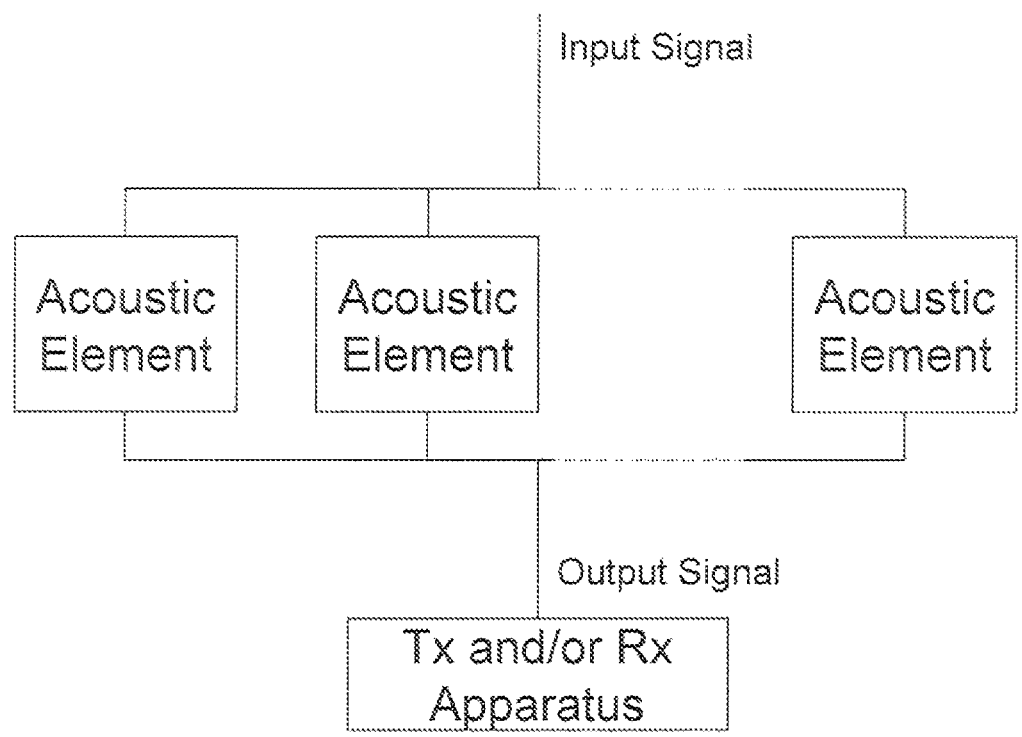
FIG. 8 shows an exemplary method and apparatus for filtering a signal.

Various embodiments of the invention may further include radio-frequency (RF) transmission equipment that may include one or more filtering devices according to the embodiments described above. For example, FIG. 8 shows an exemplary method and apparatus for filtering a signal, such as an RF signal, in which an input signal is provided in parallel to a number of acoustic elements, and the resulting outputs are combined to provide an output signal. The output signal may be provided to transmit and/or receive apparatus (e.g., a transmitter/antenna or a receiver or other related signal processing apparatus). Similarly, the input signal may be obtained from transmit apparatus (e.g., a modulator) and/or receive apparatus (e.g., an antenna) (not shown). Hence, such filtering may be used in transmission of signals of various types in various types of communication stations (e.g., base stations, mobile stations, etc.), which may be included in mobile radio networks, such as, but not limited to, networks implemented according to $3^{rd}$-Generation Partnership Project (3GPP) standards (including, e.g., LTE, LTE-A, et al.), WiMax, WiFi, et al. or fixed radio networks (e.g., microwave networks, satellite networks, etc.).

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination. Only a few implementations are disclosed. However, it is understood that variations and enhancements may be made.

Various embodiments of the invention have been presented above. However, the invention is not intended to be limited to the specific embodiments presented, which have been presented for purposes of illustration. Rather, the invention extends to functional equivalents as would be within the scope of the appended claims. Those skilled in the art, having the benefit of the teachings of this specification, may make numerous modifications without departing from the scope and spirit of the invention in its various aspects.

What is claimed is:

1. A filter device, comprising:
   one or more 2-port acoustic resonators coupled in parallel between a source node and a load node, each of the one or more 2-port acoustic resonators comprising:
   an input terminal; and
   a ground terminal; and
   one or more 1-port acoustic resonators coupled in parallel with the one or more 2-port acoustic resonators between the source node and the load node, at least one of the one or more 1-port acoustic resonators comprising a 2-port acoustic resonator having an input terminal and a ground terminal and arranged to implement the 1-port acoustic resonator.

2. The filter device, as in claim 1, wherein at least one of the one or more 2-port acoustic resonators comprises an Inter Digital Transducer (IDT).

3. The filter device as in claim 2, wherein at least two acoustic resonators are acoustically coupled.

4. The filter device as in claim 3, wherein the filter is designed to have an odd number of resonances.

5. The filter device as in claim 1, wherein at least one of the one or more 2-port acoustic resonators includes a surface acoustic wave (SAW) device.

6. The filter device as in claim 1, wherein at least one of the one or more 2-port acoustic resonators includes a dual-mode SAW (DIMS) resonator.

7. The filter device as in claim 1, wherein at least one of the one or more 2-port acoustic resonators includes a bulk acoustic wave (BAW) device.

8. The filter device as in claim 1, further comprising at least one impedance matching circuit coupled to the input node or to the output node.

9. A communication station comprising:
   a transmit or receive device; and
   the filter device as in claim 1 coupled to receive a signal from or to provide a signal to the transmit or receive device.

10. A filter device, comprising:
at least two acoustic elements coupled in parallel between a source node and a load node, wherein the at least two acoustic elements are arranged to filter a signal presented at the source node and output a filtered signal to the load node, the at least two acoustic elements including:
at least one two-port acoustic element coupled between the source node and the load node; and
at least one one-port acoustic element coupled in parallel to the at least one two-port acoustic element between the source node and the load node.

11. The filter device as in claim 10, wherein one or more of the at least one one-port acoustic element comprises a two-port acoustic element arranged to implement a one-port acoustic element.

12. The filter device as in claim 10, wherein at least one of the at least two acoustic elements comprises at least one Inter Digital Transducer (IDT).

13. The filter device as in claim 10, wherein at least one of the at least two acoustic elements comprises a surface acoustic wave (SAW) device or a hulk acoustic wave (SAW) device.

14. The filter device as in claim 10, further comprising at least one impedance matching circuit coupled to the source node or to the load node.

15. A communication station comprising:
a transmit or receive device; and
the filter device as in claim 10 coupled to receive a signal from or to provide signal to the transmit or receive device.

16. A method comprising:
directing an input signal into two or more parallel acoustic elements, the two or more parallel acoustic elements including at least one one-port acoustic element and at least one two-port acoustic element arranged to each other; and
combining outputs of the two or inure parallel acoustic elements to obtain a filtered output signal.

17. The method of claim 16, wherein input signal is received from a component of a communication device.

18. The method of claim 17, where in the component comprises a modulator or an antenna.

19. The method of claim 16, further comprising:
forwarding the filtered output signal to a component of communication device.

20. The method of claim 19, wherein the component comprises a modulator or an antenna.

21. The method of claim 16, further comprising directing the input signal and/or the filtered output signal through at least one impedance matching element.

22. The method of claim 16, wherein one or more of the at least one one-port acoustic element comprises a two-port acoustic element connected to implement a one-port acoustic element.

* * * * *

UNITED STATES PATENT AND TRADEMARK OFFICE
CERTIFICATE OF CORRECTION

| | |
|---|---|
| PATENT NO. | : 8,620,250 B2 |
| APPLICATION NO. | : 13/283292 |
| DATED | : December 31, 2013 |
| INVENTOR(S) | : Erb |

It is certified that error appears in the above-identified patent and that said Letters Patent is hereby corrected as shown below:

In the Specifications

In Column 4, Line 59, delete "May" and insert -- may --, therefor.

In the Claims

In Column 6, Line 44, in Claim 2, delete "device, as in" and insert -- device as in --, therefor.

In Column 6, Line 56, in Claim 6, delete "(DIMS)" and insert -- (DMS) --, therefor.

In Column 7, Line 23, in Claim 13, delete "hulk acoustic wave (SAW)" and insert -- bulk acoustic wave (BAW) --, therefor.

In Column 8, Line 2, in Claim 15, delete "signal" and insert -- a signal --, therefor.

In Column 8, Line 8, in Claim 16, delete "arranged to" and insert -- arranged in parallel to --, therefor.

In Column 8, Line 10, in Claim 16, delete "inure" and insert -- more --, therefor.

In Column 8, Line 14, in Claim 18, delete "where in" and insert -- wherein --, therefor.

In Column 8, Line 16, in Claim 19, delete "component of" and insert -- component of a --, therefor.

Signed and Sealed this
Thirteenth Day of May, 2014

Michelle K. Lee
*Deputy Director of the United States Patent and Trademark Office*